United States Patent
Kajiyama

(10) Patent No.: US 10,340,262 B2
(45) Date of Patent: Jul. 2, 2019

(54) OPTOELECTRONIC SEMICONDUCTOR DEVICE HAVING ELECTRODE JUNCTION WITH LOW REFLECTIVITY

(71) Applicant: ULTRA DISPLAY TECHNOLOGY CORP., Taipei (TW)

(72) Inventor: Yoshitaka Kajiyama, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 0 days.

(21) Appl. No.: 16/236,168

(22) Filed: Dec. 28, 2018

(65) Prior Publication Data

US 2019/0157254 A1  May 23, 2019

Related U.S. Application Data

(62) Division of application No. 15/696,541, filed on Sep. 6, 2017, now Pat. No. 10,211,195.

(30) Foreign Application Priority Data

Sep. 7, 2016 (TW) .............................. 105128993 A

(51) Int. Cl.
| | | |
|---|---|---|
| H01L 25/00 | (2006.01) |
| H01L 21/683 | (2006.01) |
| H01L 25/13 | (2006.01) |
| H01L 25/075 | (2006.01) |
| H01L 33/50 | (2010.01) |
| H01L 33/60 | (2010.01) |

(52) U.S. Cl.
CPC .......... *H01L 25/50* (2013.01); *H01L 21/6835* (2013.01); *H01L 25/0753* (2013.01); *H01L 25/13* (2013.01); *H01L 33/50* (2013.01); *H01L 33/60* (2013.01); *H01L 2933/0058* (2013.01)

(58) Field of Classification Search
None
See application file for complete search history.

(56) References Cited

U.S. PATENT DOCUMENTS

| | | | | |
|---|---|---|---|---|
| 6,780,696 B1 * | 8/2004 | Schatz | ................... | H01L 24/95 257/688 |
| 7,926,176 B2 * | 4/2011 | Huber | ................. | B81C 1/00007 29/602.1 |

(Continued)

*Primary Examiner* — Bilkis Jahan
(74) *Attorney, Agent, or Firm* — Muncy, Geissler, Olds & Lowe, P.C.

(57) ABSTRACT

An optoelectronic semiconductor device is disclosed. The optoelectronic semiconductor device includes a matrix substrate including a matrix circuit and a substrate, and a plurality of microsized optoelectronic semiconductor elements disposed separately and disposed on the matrix circuit. Each of the microsized optoelectronic semiconductor elements includes a first electrode and a second electrode, the matrix circuit includes a plurality of third electrodes and a plurality of fourth electrodes. The first electrodes are coupled with and electrically connected with the third electrodes respectively, or the second electrodes are coupled with and electrically connected with the fourth electrodes respectively. Reflectivities of at least some of junctions between the first electrode and the third electrode, or reflectivities of at least some of junctions between the second electrode and the fourth electrode are less than 20%.

12 Claims, 13 Drawing Sheets

(56) References Cited

U.S. PATENT DOCUMENTS

| | | | |
|---|---|---|---|
| 8,349,653 B2* | 1/2013 | Parvarandeh | H01L 24/95 |
| | | | 438/108 |
| 9,137,935 B2* | 9/2015 | Morris | H01L 24/95 |
| 2002/0028045 A1 | 3/2002 | Yoshimura et al. | |
| 2002/0097962 A1* | 7/2002 | Yoshimura | G02B 6/10 |
| | | | 385/50 |
| 2010/0119192 A1* | 5/2010 | Fujikata | B82Y 20/00 |
| | | | 385/14 |
| 2014/0038392 A1* | 2/2014 | Yonehara | H01L 21/304 |
| | | | 438/463 |
| 2016/0218326 A1 | 7/2016 | Fleissner et al. | |

* cited by examiner

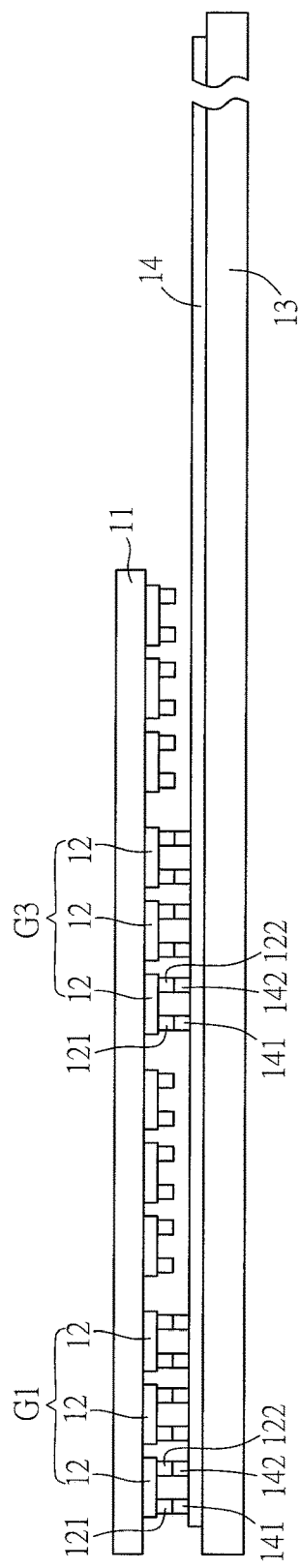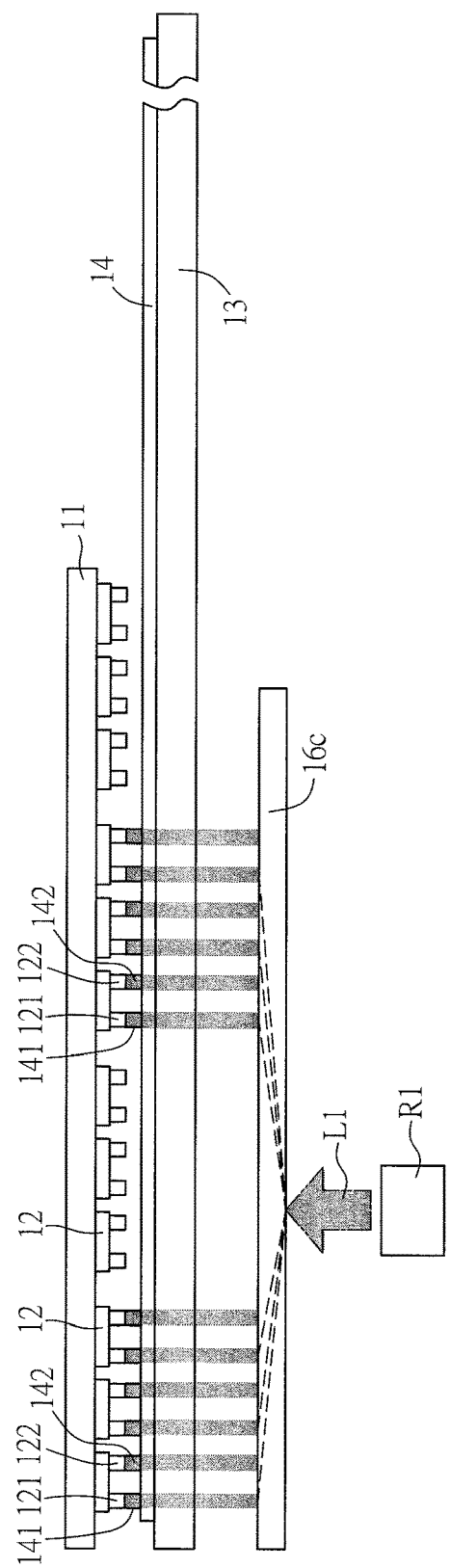

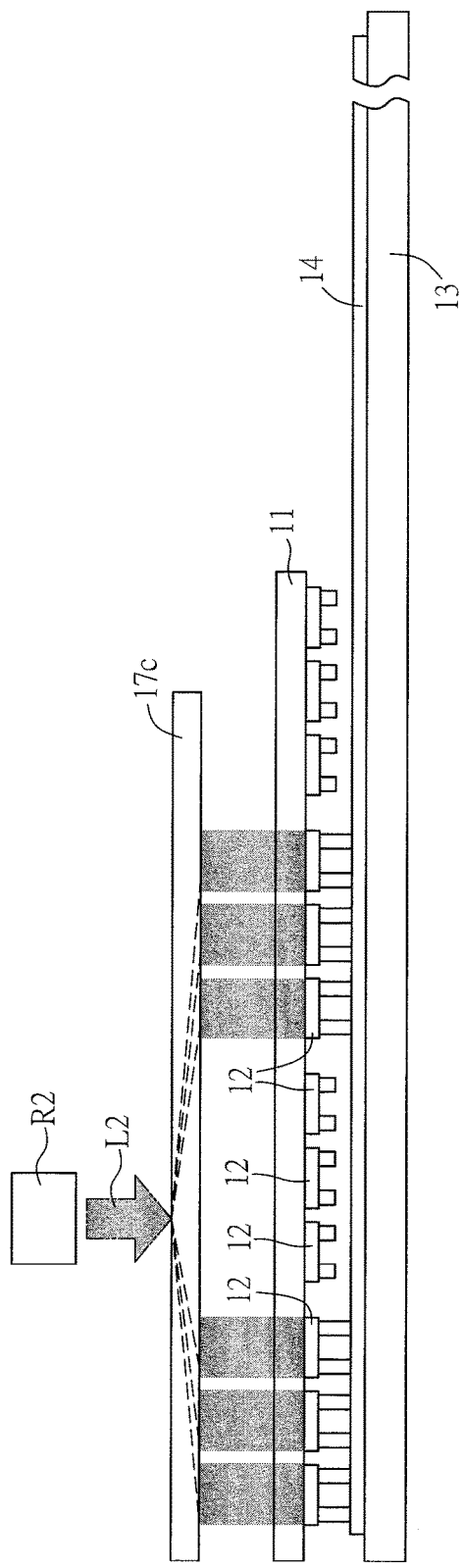
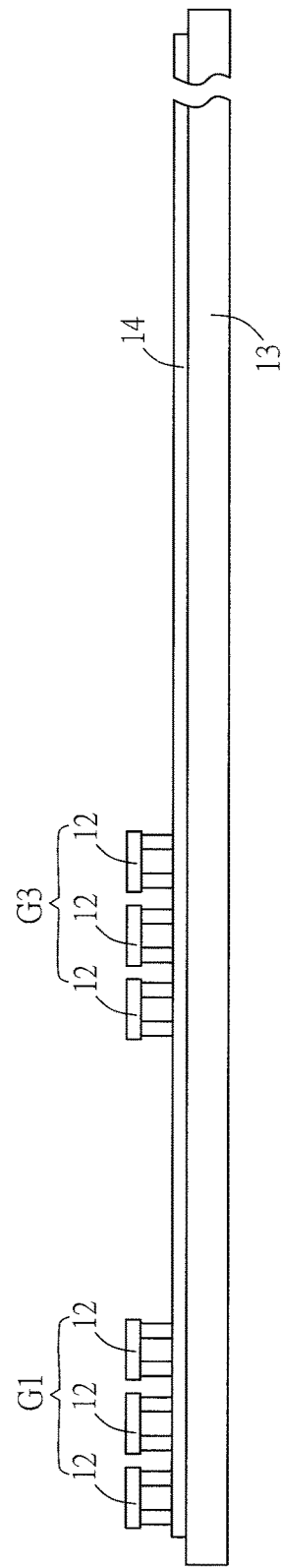
FIG.5C
FIG.5D

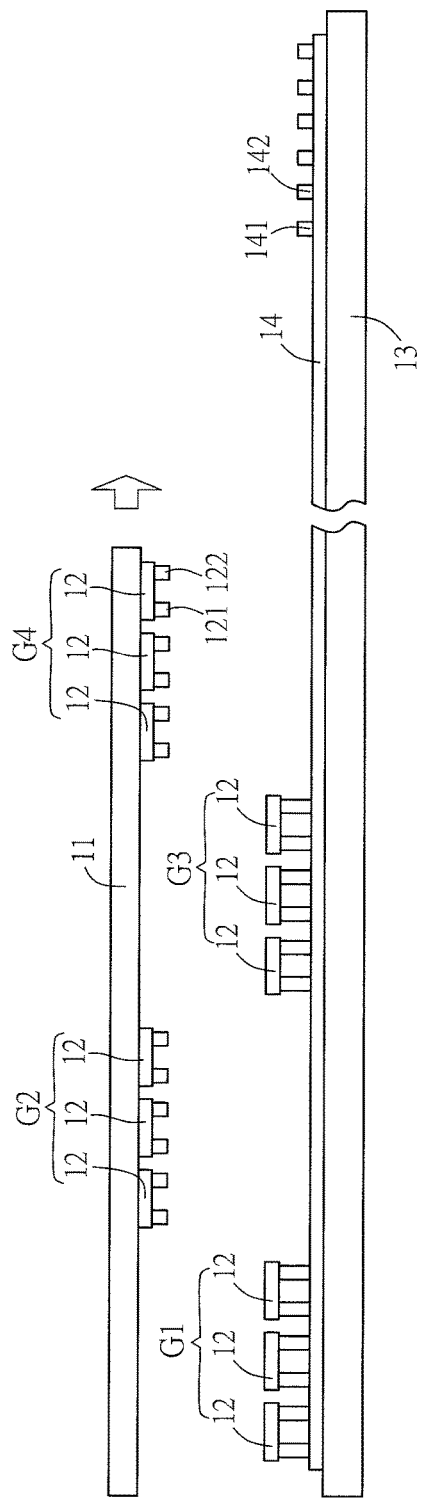
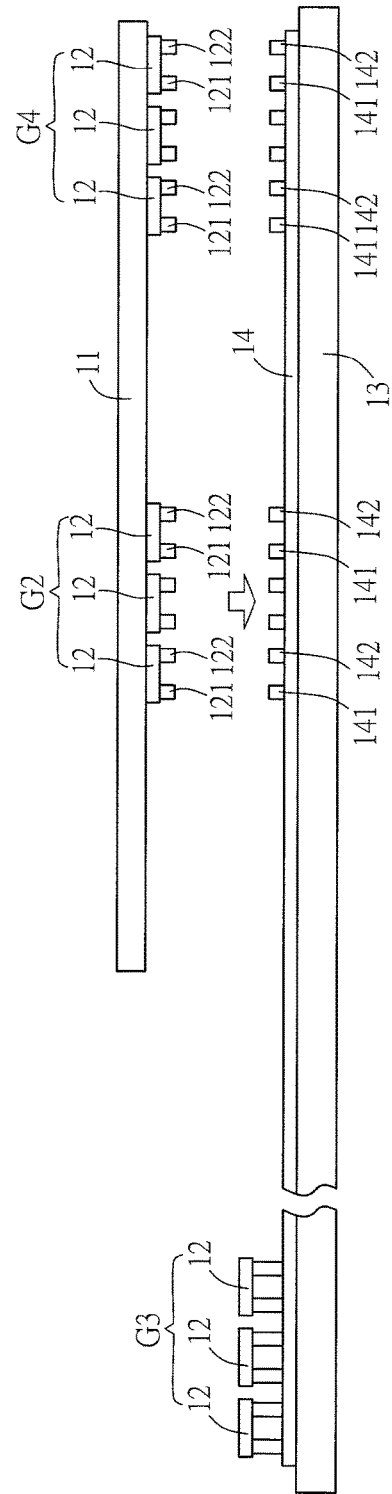
FIG.5E
FIG.5F

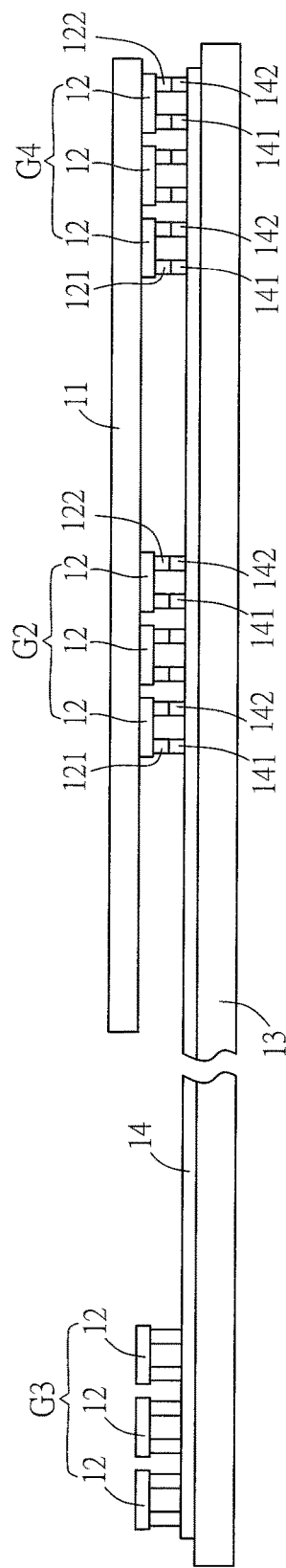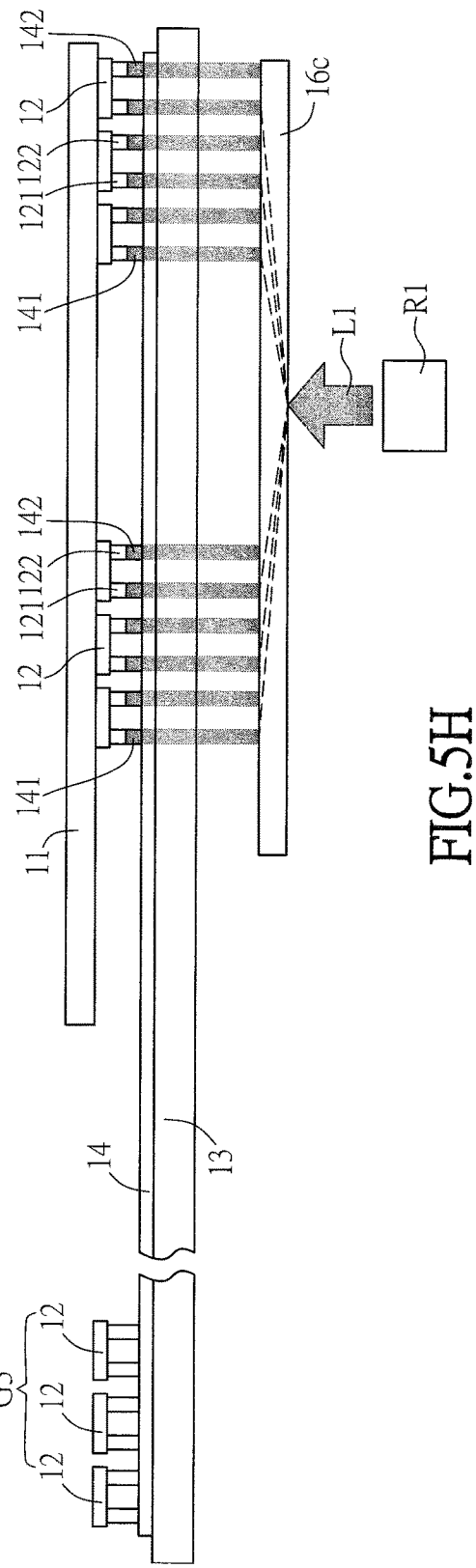
FIG.5G
FIG.5H

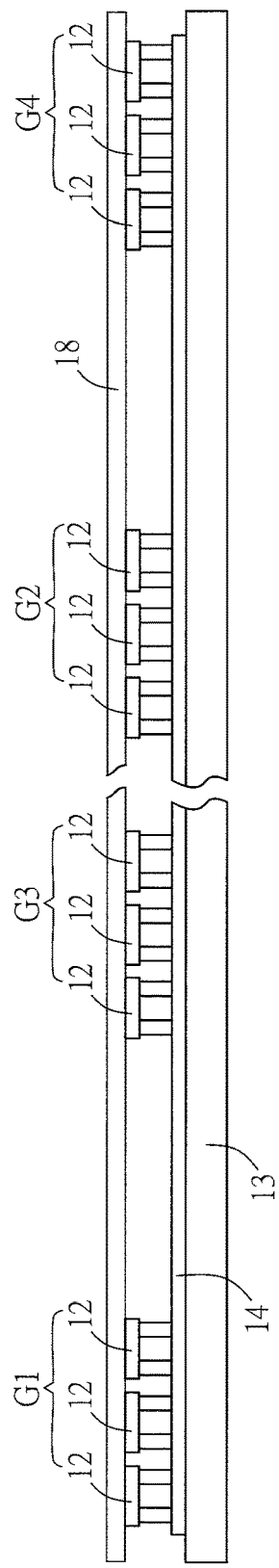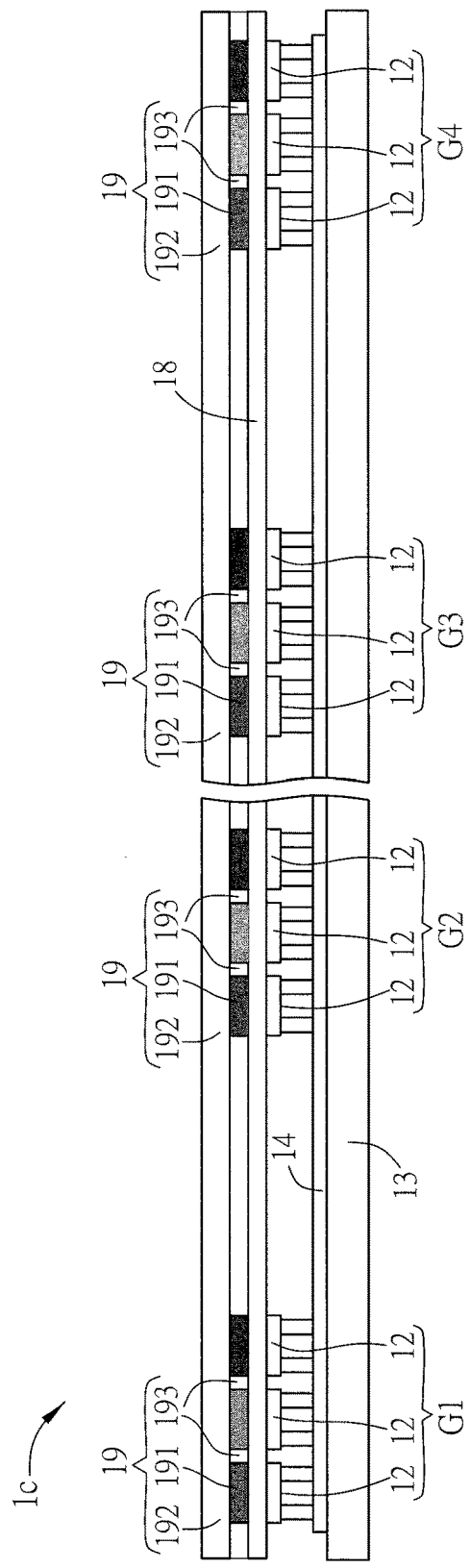

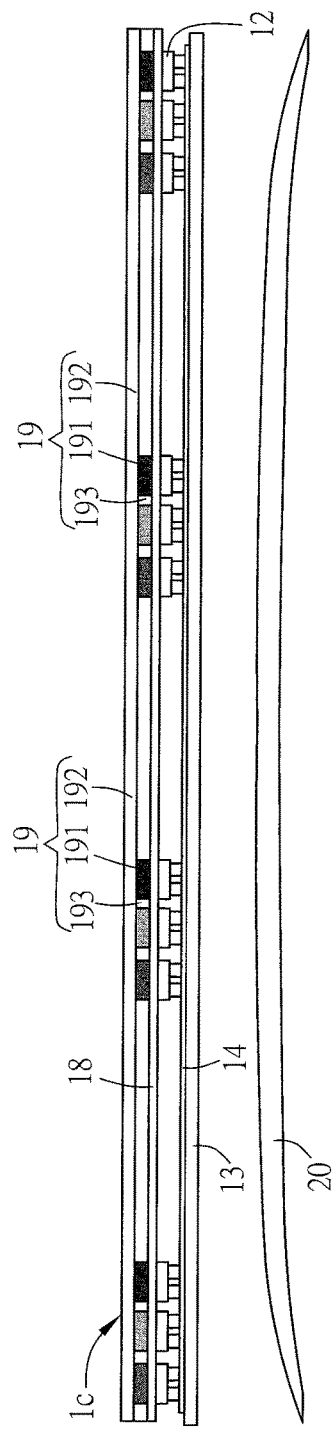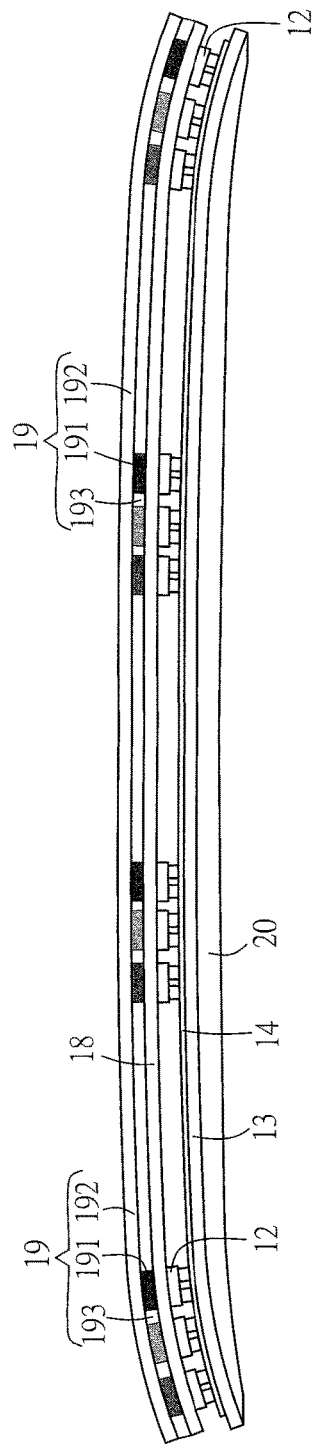
FIG.6A
FIG.6B

OPTOELECTRONIC SEMICONDUCTOR DEVICE HAVING ELECTRODE JUNCTION WITH LOW REFLECTIVITY

CROSS REFERENCE TO RELATED APPLICATIONS

This application is a Divisional Application (DA) of an earlier filed, pending, application, having application Ser. No. 15/696,541 and filed on Sep. 6, 2017, the content of which, including drawings, is expressly incorporated by reference herein.

BACKGROUND OF THE INVENTION

Field of Invention

This invention relates to a semiconductor device and, in particular, to an optoelectronic semiconductor device and a manufacturing method thereto.

Related Art

In comparison with the conventional liquid crystal display device, the micro LED array display composed of micro LEDs (μLEDs) is more contributive to the purposes of lightness and thinness because it doesn't require an additional backlight source.

In the conventional procedure of manufacturing an optoelectronic device (such as a display) by using LEDs (the length of a side is greater than 100 μm), the epitaxial process is used to form LEDs, and then the half cutting (electrical insulation), probing and full cutting are performed to obtain the individual LEDs, which are subsequently transferred to a carrying substrate. Then, one or more LEDs are picked up from the carrying substrate by a pick-up head to be transferred to, for example, the matrix circuit substrate for the subsequent processes. However, with regard to the μLEDs, because they have a smaller size in the length of a side (less than 100 μm, such as 25 μm or less), when they are used to form the optoelectronic device in the manufacturing procedure the same as mentioned above, they require a higher accuracy of the equipment and a higher cost as well as a complicated process, and therefore the manufacturing time and cost of the optoelectronic device will be increased.

SUMMARY OF THE INVENTION

An objective of the invention is to provide an innovative optoelectronic semiconductor device and a manufacturing method thereof. In comparison with the conventional optoelectronic semiconductor device of LEDs and the manufacturing method thereof, the optoelectronic semiconductor device of this invention and the manufacturing method thereof have the advantage of a simpler and faster process, so that the optoelectronic semiconductor device can be reduced in the manufacturing time and cost.

A manufacturing method of an optoelectronic semiconductor device comprises steps of: a step of providing a microsized optoelectronic semiconductor element, a step of providing a matrix substrate, a step of electrode alignment and lamination, a step of electrode coupling, a step of illumination and lift-off and a step of removal. The step of providing a microsized optoelectronic semiconductor element is performed, wherein a plurality of microsized optoelectronic semiconductor elements are disposed separately and disposed on an epitaxial substrate, and each of the microsized optoelectronic semiconductor elements includes a first electrode and a second electrode. The step of providing a matrix substrate is performed, wherein a matrix circuit is disposed on a substrate and includes a plurality of third electrodes and a plurality of fourth electrodes. The step of electrode alignment and lamination is performed, wherein the epitaxial substrate and the substrate are laminated correspondingly, and at least some of the first electrodes contact with the third electrodes respectively or at least some of the second electrodes contact with the fourth electrodes respectively. The step of electrode coupling is performed, wherein a first light is provided to concentratedly illuminate at least some of junctions between the first electrodes and the third electrodes or concentratedly illuminate at least some of junctions between the second electrodes and the fourth electrodes. The step of illumination and lift-off is performed, wherein a second light is provided to concentratedly illuminate at least some of interfaces between the microsized optoelectronic semiconductor elements and the epitaxial substrate to peel off the microsized optoelectronic semiconductor elements from the epitaxial substrate. The step of removal is performed, wherein the epitaxial substrate is removed.

In one embodiment, the step of electrode coupling is performed before the step of illumination and lift-off, or after the step of illumination and lift-off, or at the same time as the step of illumination and lift-off.

In one embodiment, in the step of providing a microsized optoelectronic semiconductor element, a length of a side of each of the microsized optoelectronic semiconductor elements is greater than 1 μm and less than 100 μm.

In one embodiment, in the step of electrode coupling, a reflectivity of the junction between the first electrode and the third electrode or a reflectivity of the junction between the second electrode and the fourth electrode is less than 20%.

In one embodiment, in the step of electrode coupling, the manufacturing method further comprises a step of: providing a microlens array to make the first light to concentratedly illuminate at least some of the junctions between the first electrodes and the third electrodes or at least some of the junctions between the second electrodes and the fourth electrodes.

In one embodiment, in the step of illumination and lift-off, the manufacturing method further comprises a step of: providing a microlens array to make the second light concentratedly illuminate at least some of the interfaces between the microsized optoelectronic semiconductor elements and the epitaxial substrate.

An optoelectronic semiconductor device comprises a matrix substrate and a plurality of microsized optoelectronic semiconductor elements. The matrix substrate includes a matrix circuit and a substrate, wherein the matrix circuit is disposed on the substrate. The microsized optoelectronic semiconductor elements are disposed separately and disposed on the matrix circuit. Each of the microsized optoelectronic semiconductor elements includes a first electrode and a second electrode, and the matrix circuit includes a plurality of third electrodes and a plurality of fourth electrodes. The first electrodes are coupled with and electrically connected with the third electrodes respectively or the second electrodes are coupled with and electrically connected with the fourth electrodes respectively. Reflectivities of at least some of junctions between the first electrode and the third electrode or reflectivities of at least some of junctions between the second electrode and the fourth electrode are less than 20%.

In one embodiment, the substrate is a soft substrate.

As mentioned above, the manufacturing method of the optoelectronic semiconductor device of the invention includes the step of providing a microsized optoelectronic semiconductor element, a step of providing a matrix substrate, a step of electrode alignment and lamination, a step of electrode coupling, a step of illumination and lift-off and a step of removal. The step of electrode coupling is to provide a first light to concentratedly illuminate at least some of the junctions between the first electrodes and the third electrodes or concentratedly illuminate at least some of the junctions between the second electrodes and the fourth electrodes. The step of illumination and lift-off is to provide a second light to concentratedly illuminate at least some of the interfaces between the microsized optoelectronic semiconductor elements and the epitaxial substrate so that the microsized optoelectronic semiconductor elements illuminated by the second light can peel off from the epitaxial substrate. However, for the optoelectronic device manufactured by using conventional LEDs, the epitaxial and photolithography processes are used and then the half cutting, probing and full cutting are performed to obtain the individual LEDs, which are then transferred for the subsequent processes. Therefore, in comparison with the conventional art, individual LEDs needn't be transferred to other substrates in the manufacturing process of the optoelectronic semiconductor device of this invention, so the manufacturing process is simpler and faster, and the optoelectronic semiconductor device is reduced in the manufacturing time and cost.

BRIEF DESCRIPTION OF THE DRAWINGS

The invention will become more fully understood from the detailed description and accompanying drawings, which are given for illustration only, and thus are not limitative of the present invention, and wherein:

FIGS. 5A to 5L are schematic diagrams of the manufacturing process of the optoelectronic semiconductor device of the fourth embodiment of the invention; and FIGS. 6A and 6B are schematic diagrams of an application of the optoelectronic semiconductor device of the fourth embodiment of the invention.

DETAILED DESCRIPTION OF THE INVENTION

The present invention will be apparent from the following detailed description, which proceeds with reference to the accompanying drawings, wherein the same references relate to the same elements.

The embodiments of the optoelectronic semiconductor device with the manufacturing method thereof of this invention will be illustrated with reference to the figures, in which the same references relate to the same elements. The all figures of the embodiments are given for illustration only and not for representing the actual size, ratio or quantity. Besides, the terms used to describe the position such as "up" and "down" in the embodiments are only for representing the relative position. Moreover, the description of that one element is formed "on", "above", "below", or "under" another element can comprise one embodiment wherein one element directly contacts another element or another embodiment where an additional element is disposed between one element and another element so that the one element and the another element don't contact each other directly.

Figure 1:
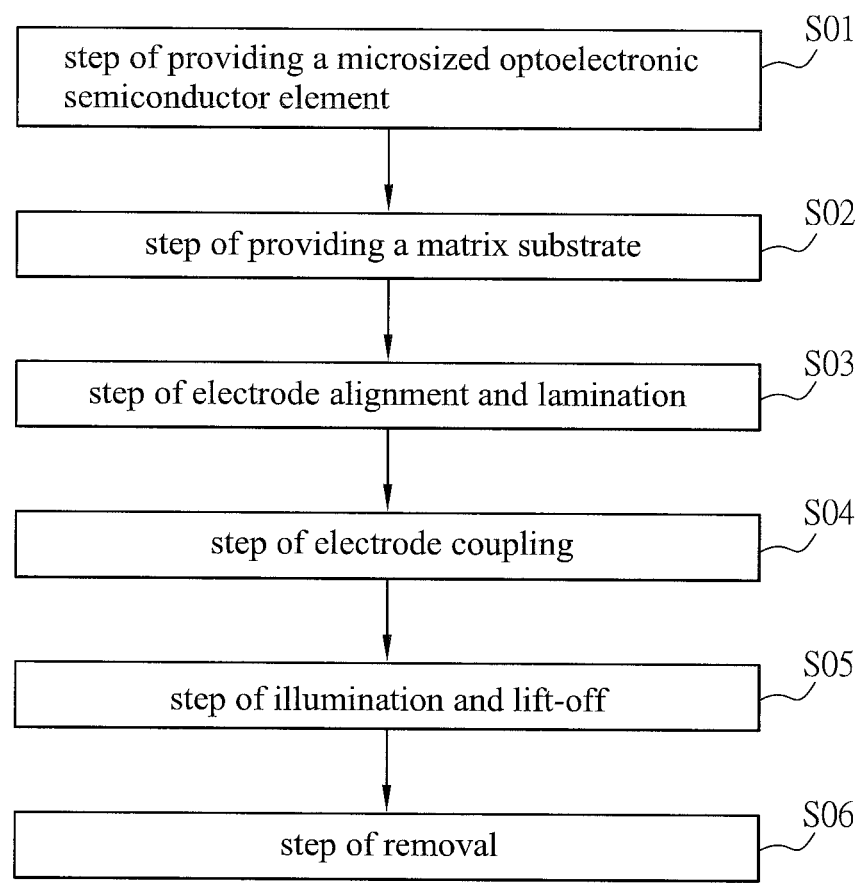
FIG. 1 is a schematic flowchart of a manufacturing method of an optoelectronic semiconductor device of an embodiment of the invention.

Please refer to FIG. 1, which is a schematic flowchart of a manufacturing method of an optoelectronic semiconductor device of an embodiment of the invention.

As shown in FIG. 1, the manufacturing method of an optoelectronic semiconductor device includes the steps of: a step of providing a microsized optoelectronic semiconductor element S01, a step of providing a matrix substrate S02, a step of electrode alignment and lamination S03, a step of electrode coupling S04, a step of illumination and lift-off S05 and a step of removal S06.

The above steps S01-S06 are illustrated with reference to FIGS. 2A to 2F, which are schematic diagrams of the manufacturing process of the optoelectronic semiconductor device of the first embodiment of the invention. The optoelectronic semiconductor device as mentioned hereinafter can be applied to a display panel, an advertisement board, a sensing device, a semiconductor device or an illuminating device, and can be a single-color device or a full-color device. The display device can be, for example, applied to a virtual reality (VR) head-mounted display, an augmented reality (AR) head-mounted display or a head-up display (HUD), but this invention is not limited thereto.

Figure 2A:
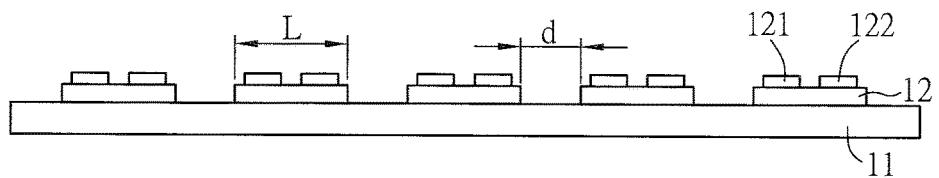
FIGS. 2A to 2F are schematic diagrams of the manufacturing process of the optoelectronic semiconductor device of the first embodiment of the invention.

As shown in FIG. 2A, in the step of providing a microsized optoelectronic semiconductor element S01, a plurality of microsized (μ) optoelectronic semiconductor elements 12 are disposed separately and disposed on an epitaxial substrate 11 to obtain a microsized optoelectronic semiconductor substrate. Each of the microsized optoelectronic semiconductor elements 12 includes a first electrode 121 and a second electrode 122.

In some embodiments, the epitaxial substrate 11 can be a wafer and can be made of transparent material or opaque material. For example, the epitaxial substrate 11 is a sapphire substrate, a GaAs substrate, or a SiC substrate. Moreover, the microsized optoelectronic semiconductor elements 12 can be arranged in an array (a two dimensional array for example) to be disposed on the epitaxial substrate 11, or arranged in a staggered manner to be disposed on the epitaxial substrate 11, but this invention is not limited thereto. A preferable case is a two dimensional array arrangement. The length of a side L of each of the microsized optoelectronic semiconductor elements 12 is greater than 1 μm and less than 100 μm (1 μm<L<100 μm). In some embodiments, one of the microsized optoelectronic semiconductor elements 12 can be 25 μm×25 μm, and a minimum interval d between two adjacent microsized optoelectronic semiconductor elements 12 is, for example but not limited to, 1 μm or less.

In this embodiment, the epitaxial substrate 11 is a transparent sapphire substrate, and the material of the microsized optoelectronic semiconductor elements 12 is, for example but not limited to, GaN, and it can be formed on the epitaxial substrate 11 by the epitaxial method. For example, the microsized optoelectronic semiconductor elements 12 can be formed on the epitaxial substrate 11 by the epitaxial, coating, photolithography and etching processes by using MOCVD (Metal-organic Chemical Vapor Deposition). In different embodiments, the microsized optoelectronic semiconductor elements 12 can have other materials, such as AlGaAs, GaP, GaAsP, AlGaInP, or GaN, and can be disposed on the epitaxial substrate 11 by other methods. However, this invention is not limited thereto.

Moreover, the microsized optoelectronic semiconductor element 12 can be a dual-electrode element (an LED for example unlimitedly) or a triple-electrode element (a transistor for example). The microsized optoelectronic semiconductor element 12 of this embodiment is an LED as an example. The electrode arrangement of the LED can be that the p electrode and n electrode are disposed on the same side (the horizontal structure) or that the p electrode and the n electrode are respectively disposed on the up side and the down side (the type of the up and down sides conductive to each other, or the vertical structure). The microsized optoelectronic semiconductor element 12 of this embodiment is a μLED of horizontal structure for example. Moreover, with regard to the category of the wavelength of the displayed color, when the microsized optoelectronic semiconductor element 12 is a μLED, it can be a blue LED, a red LED, a green LED, an infrared LED, an ultraviolet LED, or their any combination.

Figure 2B:
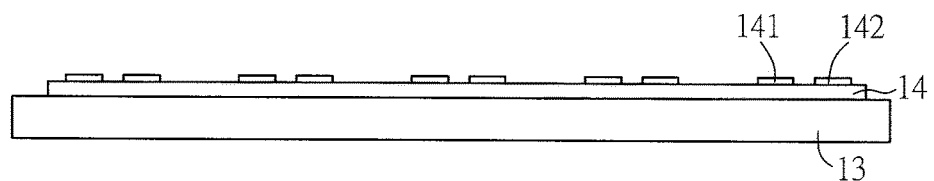

In the step of providing a matrix substrate S02, as shown in FIG. 2B, a matrix circuit 14 is disposed on a substrate 13 to obtain a matrix substrate. The matrix circuit 14 includes a plurality of third electrodes 141 and a plurality of fourth electrodes 142.

The substrate 13 can have transparent material, such as glass, quartz or the like, plastic material, rubber, glass fiber or other polymer material. The substrate 13 also can be made of opaque material and can be, for example, a metal-fiberglass composite plate or a metal-ceramics composite plate. Moreover, the substrate 13 also can be a hard plate or a soft plate. The soft plate is flexible and also called a flexible substrate, such as a flexible circuit board, which can include organic polymer material or thermoplastic material, for example, PI (polyimide), PE (polyethylene), PVC (Polyvinylchloride), PS (polystyrene), acrylic, fluoropolymer, polyester or nylon, and this invention is not limited thereto. Besides, the matrix circuit 14 and the substrate 13 can be collectively called the matrix substrate, and according to the circuit style formed on the substrate 13, can be an active matrix substrate or a passive matrix substrate. For example, the matrix substrate can be a matrix substrate of a liquid crystal display (LCD) apparatus and configured with intersected data lines and scan lines. Moreover, the step of providing a microsized optoelectronic semiconductor element S01 can be performed before the step of providing a matrix substrate S02 or after the step of providing a matrix substrate S02 or at the same time as the step of providing a matrix substrate S02.

Figure 2C:
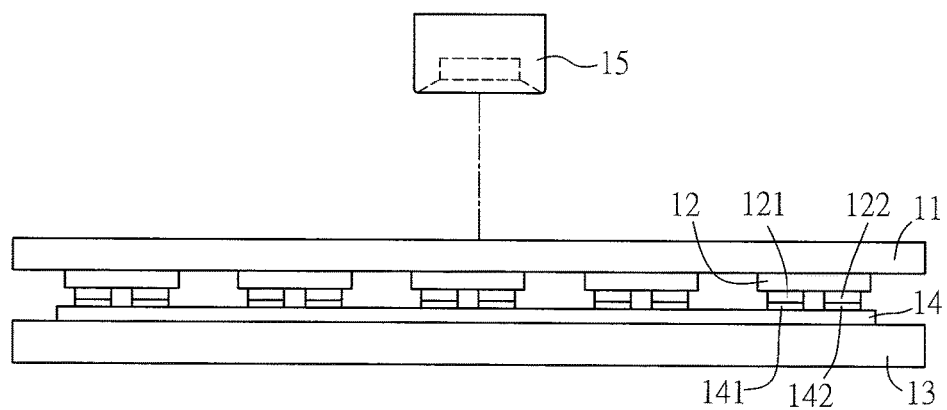

In the step of electrode alignment and lamination S03, as shown in FIG. 2C, the epitaxial substrate 11 and the substrate 13 are laminated together, and at least some of the first electrodes 121 are made contact with the third electrodes 141 respectively or at least some of the second electrodes 122 are made contact with the fourth electrodes 142 respectively. Herein, the epitaxial substrate 11 including the microsized optoelectronic semiconductor elements 12 as shown in FIG. 2A are disposed inversely, so that the first electrodes 121 and the second electrodes 122 face downwards to face the third electrodes 141 and the fourth electrodes 142, and then the epitaxial substrate 11 and the substrate 13 are laminated correspondingly. Since this embodiment shows the μLEDs of the horizontal structure, the first electrodes 121 contact with the third electrodes 141 and the second electrodes 122 contact with the fourth electrodes 142. In this embodiment, the first electrode 121 and the second electrode 122 of each of the microsized optoelectronic semiconductor elements 12 correspond to and contact with the third electrode 141 and the fourth electrode 142 of the matrix circuit 14, respectively.

In the step S03, for the alignment, an alignment apparatus 15 can be used to make the first electrodes 121 align with the third electrodes 141 respectively or make the second electrodes 122 align with the fourth electrodes 142 respectively. In the embodiment of FIG. 2C, the alignment apparatus 15 is used to make the first electrodes 121 align with the third electrodes 141 respectively and make the second electrodes 122 align with the fourth electrodes 142 respectively, to accomplish the step of electrode alignment and lamination S03. The alignment apparatus 15 is, for example but not limited to, a CCD camera.

Figure 2D:
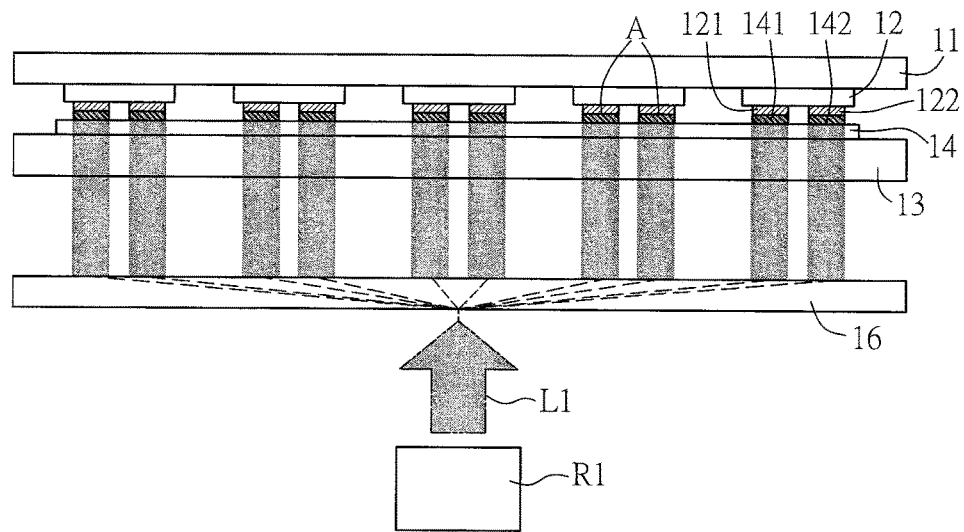

Afterwards, the step of electrode coupling S04 is performed. As shown in FIG. 2D, a first light L1 is provided to concentratedly illuminate at least some of the junctions A between the first electrodes 121 and the third electrodes 141 or at least some of the junctions A between the second electrodes 122 and the fourth electrodes 142. Herein, a light-emitting apparatus R1 is used to emit, for example but not limited to, infrared laser (the first light L1) in an upward direction to weld the first electrodes 121 and the third electrodes 141 together and the second electrodes 122 and the fourth electrodes 142 together by a laser spot welding method, so that the electrodes can be coupled and electrically connected with each other.

In order to enable the first light L1 to concentratedly illuminate each of the junctions A of the electrodes, in the step of electrode coupling S03, it can further include: providing a microlens array to enable the first light to concentratedly illuminate at least some of the junctions between the first electrodes and the third electrodes or at least some of the junctions between the second electrodes and the fourth electrodes. In this embodiment, the microlens array 16 is used to achieve the light split so as to make the first light L1 concentratedly illuminate all the junctions A between the first electrodes and the third electrodes and all the junctions A between the second electrodes and the fourth electrodes, so that every two electrodes can be firmly welded and coupled together with a less coupling resistance. However, because of using the laser spot welding for the coupling, the scorch and carbonization will formed on the junction A of the two electrodes. Therefore, in some embodiments, the reflectivity of the junction A between the first electrode E1 and the third electrode E3 or the reflectivity of the junction A between the second electrode E2 and the fourth electrode E4 will be less than 20% (generally the reflectivity will achieve 80% before welding the electrodes). In other embodiments, the reflectivity of the junction A of the two electrodes may be between 10% and 20% and even below 10%.

Figure 2E:
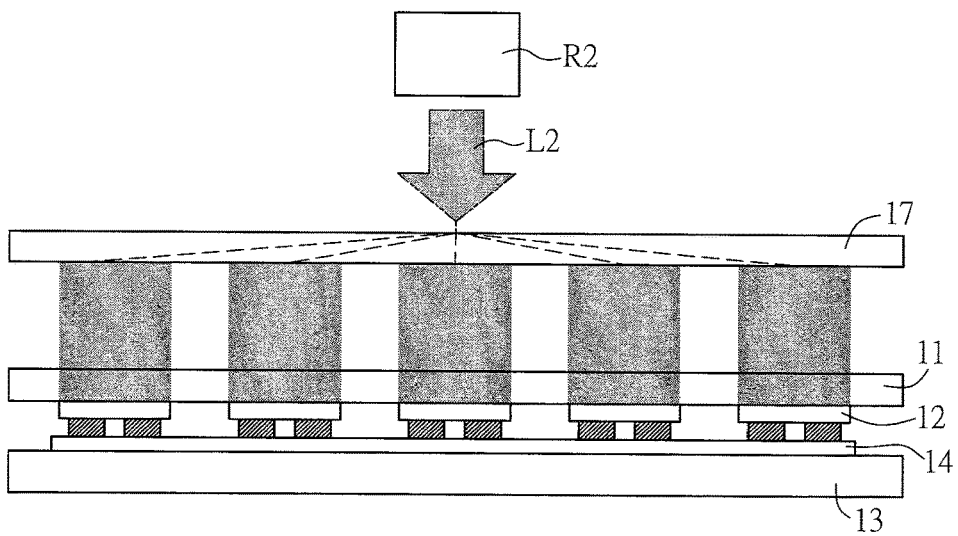

In the step of illumination and lift-off S05, as shown in FIG. 2E, a second light L2 is provided to concentratedly illuminate at least some of the interfaces between the microsized optoelectronic semiconductor elements 12 and the epitaxial substrate 11 so that the microsized optoelectronic semiconductor elements 12 illuminated by the second light L2 can peel off from the epitaxial substrate 11. Herein, another light-emitting apparatus R2 is used to emit, for example but not limited to, ultraviolet laser (UV laser, the second light L2) downwards, so as to concentratedly illuminate the interfaces between the microsized optoelectronic semiconductor elements 12 and the epitaxial substrate 11 to deteriorate the adhesion therebetween and thus to facilitate the separation of the microsized optoelectronic semiconductor elements 12 from the epitaxial substrate 11.

In order to make the second light L2 concentratedly illuminate each of the interfaces between the microsized optoelectronic semiconductor elements 12 and the epitaxial substrate 11, another microlens array 17 is provided in this embodiment so as to conduct the light split to make the second light L2 concentratedly illuminate all the interfaces between the microsized optoelectronic semiconductor elements 12 and the epitaxial substrate 11 to facilitate the separation of the microsized optoelectronic semiconductor elements 12 from the epitaxial substrate 11. The second light L2 only concentratedly illuminates the interfaces between the microsized optoelectronic semiconductor elements 12 and the epitaxial substrate 11. When the second light L2 illuminates the interfaces between the microsized optoelectronic semiconductor elements 12 and the epitaxial substrate 11, the second light L2 can illuminate the interface of a single location or the interfaces of a plurality of locations. Herein, a single location can include the interface between a single microsized optoelectronic semiconductor element 12 and the epitaxial substrate 11, or a single location can include the interfaces between a plurality of microsized optoelectronic semiconductor elements 12 and the epitaxial substrate 11. However, this invention is not limited thereto.

To be noted, in the conventional technology of illumination and lift-off, the interface of only one location can be illuminated at one time, so it will take more manufacturing time for illuminating the interfaces of multiple locations. However, in the step of illumination and lift-off S05 of this invention, it can be selected, according to the user's requirement, the type of illuminating the interface of a single location (the interface of a single location may correspond to one or more microsized optoelectronic semiconductor elements 12) at one time or the type of illuminating the interfaces between the multiple microsized optoelectronic semiconductor elements 12 and the epitaxial substrate 11 at one time. This invention is obviously different from the conventional art and thus can save the manufacturing time and cost. Herein, this method is called the selective laser lift-off technology.

To be noted, the step of electrode coupling S04 is performed before the step of illumination and lift-off S05 in this embodiment. However, in different embodiments, the step of electrode coupling S04 can be performed after the step of illumination and lift-off S05 or at the same time as the step of illumination and lift-off S05. Moreover, in this embodiment, the first light L1 is emitted from the side of the substrate 13 farther from the microsized optoelectronic semiconductor element 12 to the up side (from the bottom of the substrate 13 to the top). However, in different embodiments, the first light L1 can be emitted from the side of the epitaxial substrate 11 farther from the microsized optoelectronic semiconductor element 12 to the down side (from the top of the epitaxial substrate 11 to the bottom). This invention is not limited thereto.

Figure 2F:
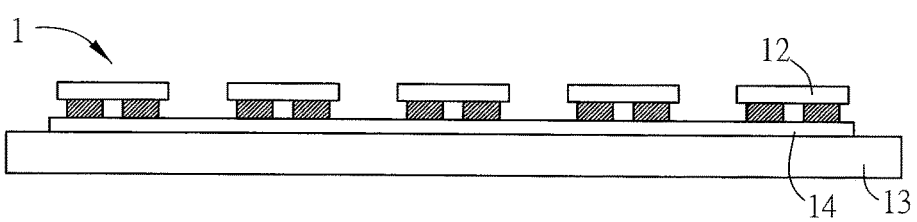
Figure 2G:
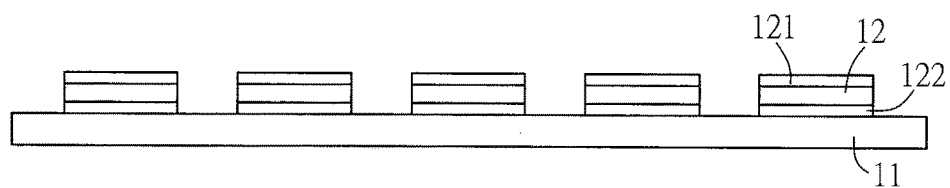
FIGS. 2G to 2J are schematic diagrams of the manufacturing process of the optoelectronic semiconductor device of a different embodiment of the invention.
Figure 2H:
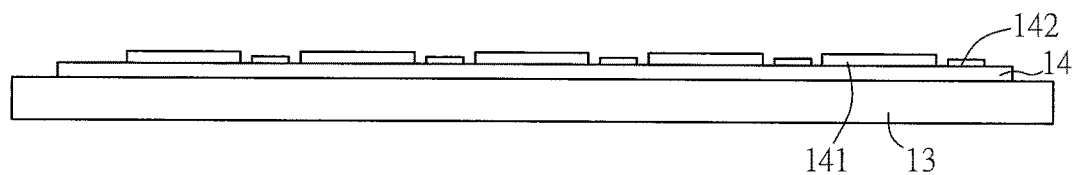

In the step of removal S06, as shown in FIG. 2F, the epitaxial substrate 11 is removed. Physically, because the interfaces between the microsized optoelectronic semiconductor elements 12 and the epitaxial substrate 11 are illuminated by the second light L2, the lift-off between the microsized optoelectronic semiconductor elements 12 and the epitaxial substrate 11 can be facilitated. Therefore, after removing the epitaxial substrate 11, the optoelectronic semiconductor device 1 can be obtained as shown in FIG. 2F.

Therefore, the optoelectronic semiconductor device 1 of this embodiment includes the substrate 13 and the matrix circuit 14, and the plurality of microsized optoelectronic semiconductor elements 12 are formed on the matrix circuit 14 and electrically connected with the matrix circuit 14. The reflectivities of the junctions between the electrodes of the microsized optoelectronic semiconductor elements 12 and the electrodes of the matrix circuit 14 are all less than 20%. Moreover, the substrate 13 and the matrix circuit 14 of this embodiment are collectively called the active matrix substrate. The active matrix substrate can be the active matrix substrate (TFT substrate) of a liquid crystal display device where the data lines, the scan lines intersecting the data lines, and the active elements (such as TFTs) are formed. Since the matrix circuit 14 and the technology for driving active matrix substrate belong to conventional art and are not the emphasis of this invention and the related content can be found by those skilled in the art, so the related description is omitted here for conciseness.

In the optoelectronic semiconductor device 1 described in the above embodiment, the microsized optoelectronic semiconductor elements 12 are all the same, and for example, are the μLEDs capable of emitting a single color light (such as blue light). So, the manufactured optoelectronic semiconductor device 1 can be a monochrome display panel.

Particularly, the microsized optoelectronic semiconductor elements 12 disposed separately are obtained by performing the epitaxial, coating, photolithography and etching processes on the epitaxial wafer and then are transferred and coupled to the matrix circuit 14 by the steps S03-S06 to obtain the optoelectronic semiconductor device 1. However, in the conventional LED manufacturing, a wafer undergoes the epitaxial and photolithography processes to obtain a plurality of LEDs and then the half cutting (electrical insulation), probing and full cutting are performed to obtain the individual LEDs, which are then transferred to a carrying substrate, and when an optoelectronic semiconductor device needs to be manufactured, one or several LEDs are transferred, for example, to an active matrix substrate (such as a silicon substrate, a metal substrate or a GaP substrate) for the subsequent processes. Therefore, in comparison with the conventional art, the manufacturing process of the optoelectronic semiconductor device 1 of this embodiment is simpler and faster, and can be applied to different technical fields according to the design requirement and also reduced in the manufacturing time and cost.

With regard to the VR or AR head-mounted display, they are formed by using OLEDs in the prior art. However, because the OLED has a larger size, the density of disposition of the OLED has its limit, and therefore the resolution of the VR or AR display is limited considerably. In contrast with the prior art, the optoelectronic semiconductor device of this invention is manufactured by using μLEDs (the microsized optoelectronic semiconductor elements 12), and since the size of μLED is very small, the density of disposition thereof can be very high, and therefore the manufactured optoelectronic semiconductor device 1 can have a higher resolution, so as to be suitable for the manufacturing of the VR or AR head-mounted display with a high resolution.

Figure 2I:
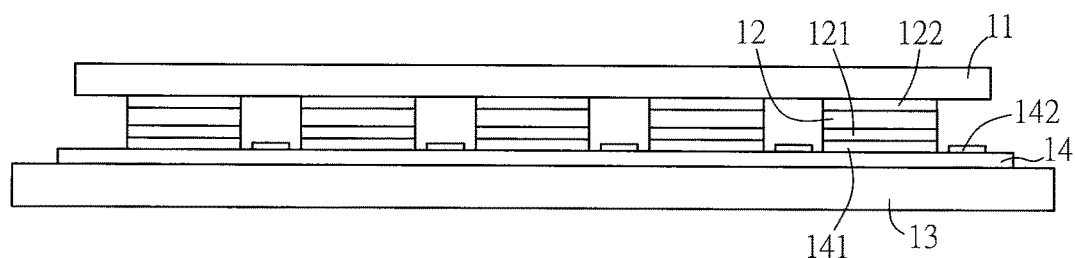
Figure 2J:
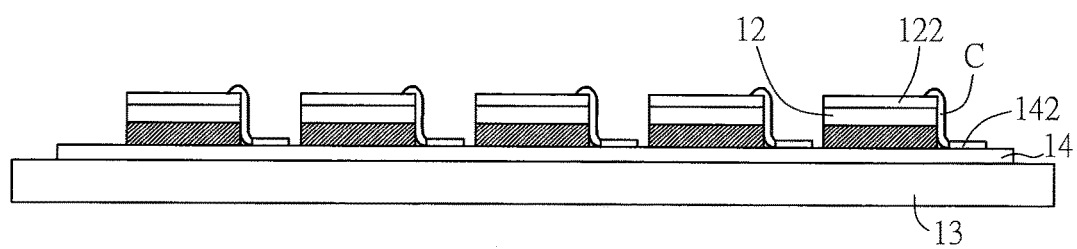

In different embodiments as shown in FIGS. 2G to 2J, which correspond to FIGS. 2A, 2B, 2C and 2F, respectively, the microsized optoelectronic semiconductor elements 12 are μLEDs of vertical structure for example. Because the microsized optoelectronic semiconductor elements 12 are μLEDs of vertical structure, only the first electrode 121 and the third electrode 141 are aligned with and contact with each other while the second electrode 122 and the fourth electrode 142 needn't be aligned with and contact with each other, as shown in FIG. 2I. Afterwards, when the step of electrode coupling S04 is performed, the first light L1 only concentratedly illuminates the junctions between the first electrodes 121 and the third electrodes 141. Therefore, after the step of illumination and lift-off S05 and the step of removal S06, only the first electrodes 121 of the microsized optoelectronic semiconductor elements are coupled with and electrically connected with the third electrodes 141 and the second electrodes 122 and the fourth electrodes 142 won't be electrically connected with each other. Then, as shown in FIG. 2J, by using the subsequent process, for example by using a conductive wire C extended from the second electrode 122 to the fourth electrode 142 and along a side of the microsized optoelectronic semiconductor element 12 (an insulating material, not shown, is needed for insulating the conductive wire C from the side of the microsized optoelectronic semiconductor element 12), the second electrode 122 and the fourth electrode 142 can be electrically connected with each other so as to accomplish the manufacturing of the optoelectronic semiconductor device.

Figure 3A:
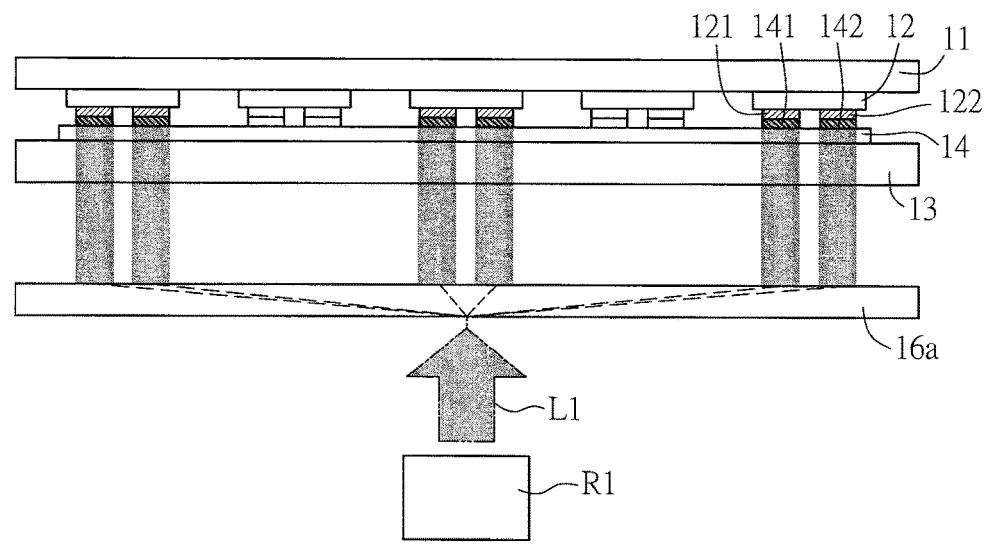
FIGS. 3A to 3C are schematic diagrams of the manufacturing process of the optoelectronic semiconductor device of the second embodiment of the invention.
Figure 3B:
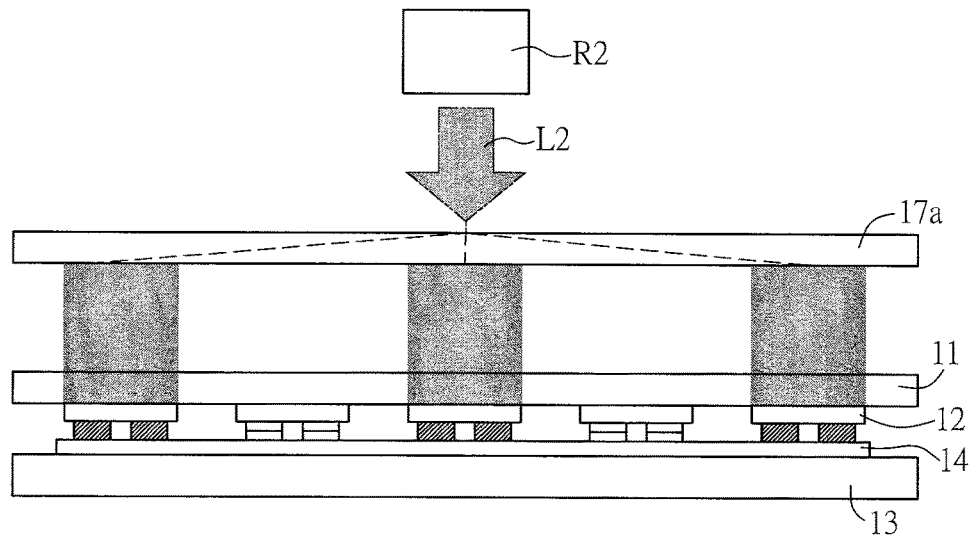
Figure 3C:
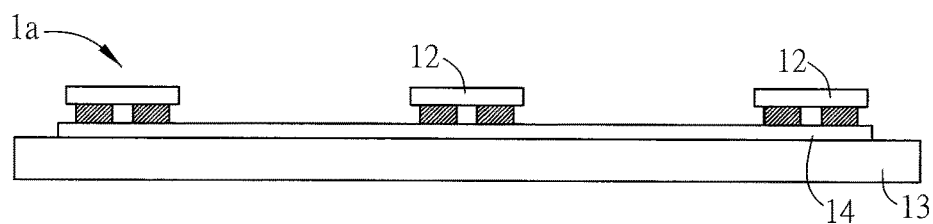
Figure 4A:
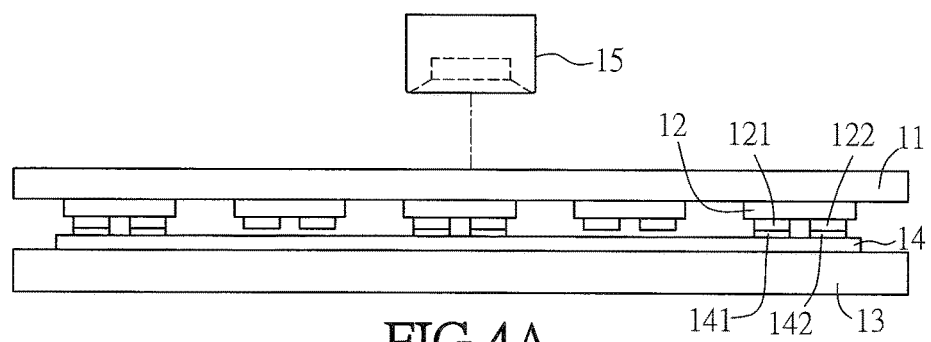
FIGS. 4A to 4C are schematic diagrams of the manufacturing process of the optoelectronic semiconductor device of the third embodiment of the invention.
Figure 4B:
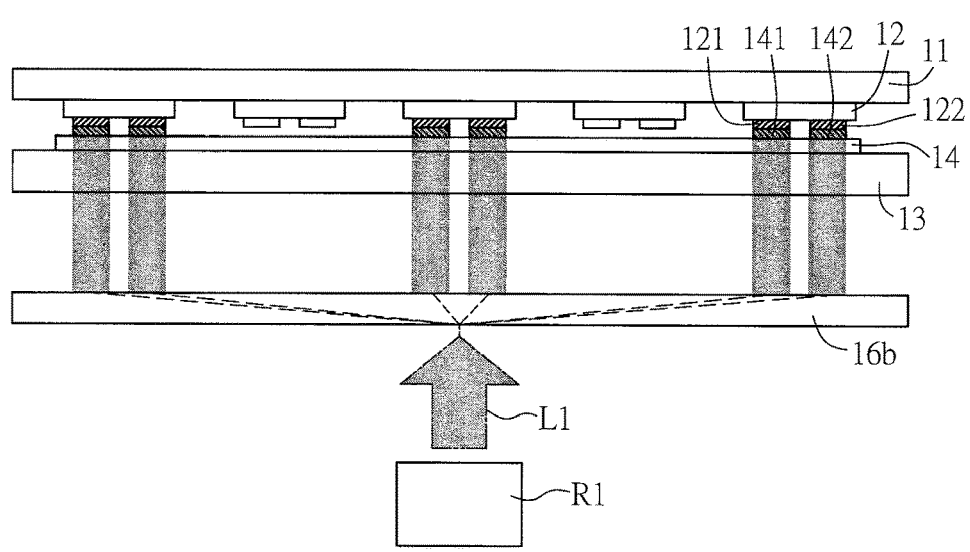
Figure 4C:
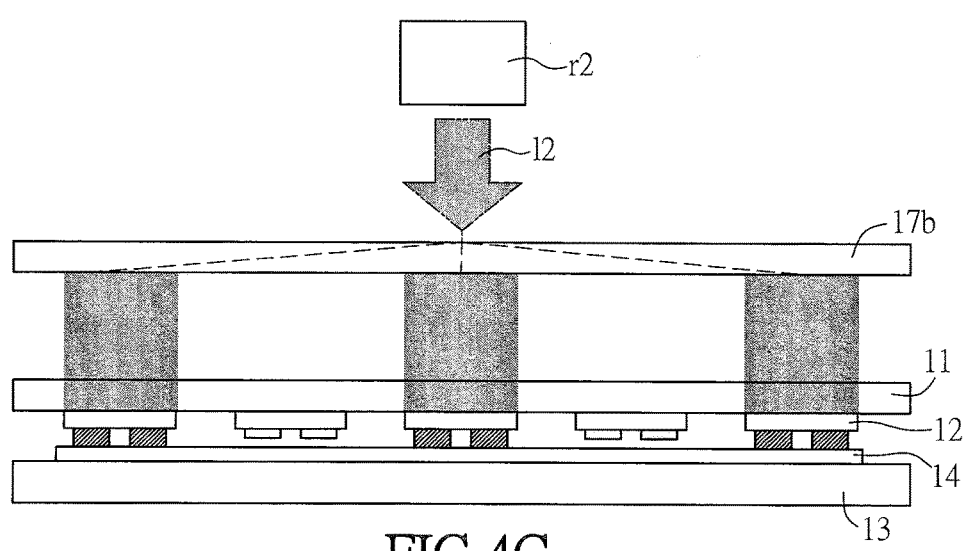

Please refer to FIGS. 3A to 4C. FIGS. 3A to 3C are schematic diagrams of the manufacturing process of the optoelectronic semiconductor device of the second embodiment of the invention, and FIGS. 4A to 4C are schematic diagrams of the manufacturing process of the optoelectronic semiconductor device of the third embodiment of the invention.

The second embodiment of FIGS. 3A to 3C includes the same steps S01-S03 as the first embodiment of FIGS. 2A to 2C, so the related description is omitted here for conciseness.

The difference from the first embodiment is in that, as shown in FIG. 3A, the first light L1 provided in the step of electrode coupling S04 is split through the microlens array 16a to only concentratedly illuminate the junctions between the first electrodes 121 of the first, the third and the fifth microsized optoelectronic semiconductor elements 12 (counted from left to right) and the third electrodes 141 and the junctions between the second electrodes 122 of the first, the third and the fifth microsized optoelectronic semiconductor elements 12 and the fourth electrodes 142, so that the first electrodes 121 and the second electrodes 122 of the first, the third and the fifth microsized optoelectronic semiconductor elements 12 are coupled with the third electrodes 141 and the fourth electrodes 142 of the matrix circuit 14, respectively.

Then, as shown in FIG. 3B, in the step of illumination and lift-off S05, the light split is performed through the microlens array 17a to make the second light L2 concentratedly illuminate the interfaces between the first, the third and the fifth microsized optoelectronic semiconductor elements 12 and the epitaxial substrate 11, so that the separation of the first, the third and the fifth microsized optoelectronic semiconductor elements 12 from the epitaxial substrate 11 can be facilitated. In other words, the first, the third and the fifth microsized optoelectronic semiconductor elements 12 receive the step of electrode coupling S04 and the step of illumination and lift-off S05, but the second and fourth microsized optoelectronic semiconductor elements 12 do not receive the step of electrode coupling S04 and the step of illumination and lift-off S05.

Therefore, after the step of removal S06, as shown in FIG. 3C, because the junctions between the first, the third and the fifth microsized optoelectronic semiconductor elements 12 and the epitaxial substrate 11 have been concentratedly illuminated by the second light L2, the separation of the first, the third and the fifth microsized optoelectronic semiconductor elements 12 from the epitaxial substrate 11 can be facilitated. Therefore, after removing the epitaxial substrate 11, the optoelectronic semiconductor device 1a of this embodiment can be obtained. The optoelectronic semiconductor device 1a of this embodiment also include the substrate 13 and the matrix circuit 14, and three microsized optoelectronic semiconductor elements 12 are electrically connected with the matrix circuit 14. An interval between two adjacent microsized optoelectronic semiconductor elements 12 of the optoelectronic semiconductor device 1a is greater than that between two adjacent microsized optoelectronic semiconductor elements 12 of the optoelectronic semiconductor device 1. Moreover, the reflectivities of the junctions between the first electrodes 121 of the first, the third and fifth microsized optoelectronic semiconductor elements 12 and the third electrodes 141 and between the second electrodes 122 of the first, the third and fifth microsized optoelectronic semiconductor elements 12 and the fourth electrodes 142 are all less than 20%.

To be noted, the step of electrode coupling S04 and the step of illumination and lift-off S05 in the second embodiment are applied to the first, the third and the fifth microsized optoelectronic semiconductor elements 12 for example, but this invention is not limited thereto. In other embodiments, it may be performed that the electrodes of the second and the fourth microsized optoelectronic semiconductor elements 12 are coupled with the corresponding electrodes of the matrix circuit 14, or may be performed in a coupling manner of different intervals (for example, at intervals of two, three, . . . microsized optoelectronic semiconductor elements 12), and this invention is not limited thereto.

The third embodiment of FIGS. 4A to 4C includes the same step S01 as the first embodiment, so the related description is omitted here for conciseness. A difference from the first embodiment of FIGS. 2A to 2F is in that, in the step of providing a matrix substrate S02 and the step of electrode alignment and lamination S03, as shown in FIG. 4A, when the matrix circuit 14 is formed on the substrate 13, the number of the electrodes of the matrix circuit 14 (including the third electrode 141 and the fourth electrode 142) is less than that of the electrodes of the microsized optoelectronic semiconductor elements 12 (including the first electrode 121 and the second electrode 122). An electrode interval between the first microsized optoelectronic semiconductor element 12 and the third microsized optoelectronic semiconductor element 12 (counted from left to right) is substantially equal to an interval between the first group of electrodes (including the third electrode 141 and the fourth electrode 142) on the matrix circuit 14 and the second group of electrodes on the matrix circuit 14 (the electrodes of the second microsized optoelectronic semiconductor element 12 do not correspond to the electrodes on the matrix circuit 14). So, the electrodes of the first microsized optoelectronic semiconductor element 12 (including the first electrode 121 and the second electrode 122) contact with the first group of electrodes of the matrix circuit 14 (including the third electrode 141 and the fourth electrode 142), and the electrodes of the third microsized optoelectronic semiconductor element 12 (including the first electrode 121 and the second electrode 122) contact with the second group of electrodes of the matrix circuit 14 (including the third electrode 141 and the fourth electrode 142) (a microsized optoelectronic semiconductor element 12 is disposed between the first group of electrodes and the second group of electrodes).

Therefore, as shown in FIG. 4B, in the step of electrode coupling S04, the provided first light L1 is split through the microlens array 16b so as to only concentratedly illuminate the junctions between the first electrodes 121 of the first, the third and the fifth microsized optoelectronic semiconductor elements 12 and the third electrodes 141 and the junctions between the second electrodes 122 of the first, the third and the fifth microsized optoelectronic semiconductor elements 12 and the fourth electrodes 142, so that the electrodes of the first, the third and the fifth microsized optoelectronic semiconductor elements 12 are coupled with the corresponding electrodes on the matrix circuit 14.

Then, as shown in FIG. 4C, in the step of illumination and lift-off S05, a microlens array 17b is used for the light split to make the second light L2 concentratedly illuminate the interfaces between the first, the third and the fifth microsized optoelectronic semiconductor elements 12 and the epitaxial substrate 11 so as to facilitate the separation of the first, the third and the fifth microsized optoelectronic semiconductor elements 12 from the epitaxial substrate 11. Therefore, after the step of removal S06, the optoelectronic semiconductor device 1a as shown in FIG. 3C also can be obtained.

Please refer to FIGS. 5A to 5L, which are schematic diagrams of the manufacturing process of the optoelectronic semiconductor device of the fourth embodiment of the invention. The number and the interval of the elements shown in FIGS. 5A to 5L are just for the illustrative purpose but not for limiting the scope of the invention.

The manufacturing method of the optoelectronic semiconductor device of this embodiment is approximately the same as the above-mentioned embodiment. However, in the step of providing a matrix substrate S02 and the step of electrode alignment and lamination S03, as shown in FIG. 5A, the number of the electrodes 141, 142 of the matrix circuit 14 on the substrate 13 is less than that of the electrodes 121, 122 of the microsized optoelectronic semiconductor elements 12.

In FIG. 5A, three microsized optoelectronic semiconductor elements 12 can be considered as a group of microsized optoelectronic semiconductor elements. Thus, from left to right, there are four groups of microsized optoelectronic semiconductor elements G1 to G4 (G2 and G4 are not marked in FIG. 5A). The matrix circuit 14 includes only two groups of electrodes 141 and 142 correspondingly, and the two groups of electrodes 141 and 142 correspond to the first group and the third group of microsized optoelectronic semiconductor elements G1 and G3, respectively. Therefore, in the step of electrode alignment and lamination S03, the electrodes of the first group of microsized optoelectronic semiconductor elements G1 contact with the first group of electrodes of the matrix circuit 14 correspondingly, and the electrodes of the third group of microsized optoelectronic semiconductor elements G3 contact with the second group of electrodes of the matrix circuit 14 correspondingly. Thereby, the optoelectronic semiconductor device can be manufactured with a larger interval or a larger size.

Moreover, the manufacturing process of FIGS. 5B and 5C are similar to the above-mentioned third embodiment of FIGS. 4B and 4C. In FIG. 5B, the first light L1 is split through the microlens array 16c so as to concentratedly illuminate the junctions between the first electrodes 121 of the first group and the third group of microsized optoelectronic semiconductor elements G1 and G3 and the third electrodes 141 and the junctions between the second electrodes 122 thereof and the fourth electrodes 142, so that the electrodes of the first group and the third group of microsized optoelectronic semiconductor elements G1 and G3 can be coupled with and electrically connected with the corresponding electrodes of the matrix circuit 14.

Then, in FIG. 5C, the microlens array 17c is used for the light split to make the second light L2 only concentratedly illuminate the interfaces between the first and the third of microsized optoelectronic semiconductor elements G1 and G3 and the epitaxial substrate 11, so as to facilitate the separation of the first group and the third group of microsized optoelectronic semiconductor elements G1 and G3 from the epitaxial substrate 11. Therefore, after the step of removal S06, the structure of FIG. 5D can be obtained.

Figure 5I:
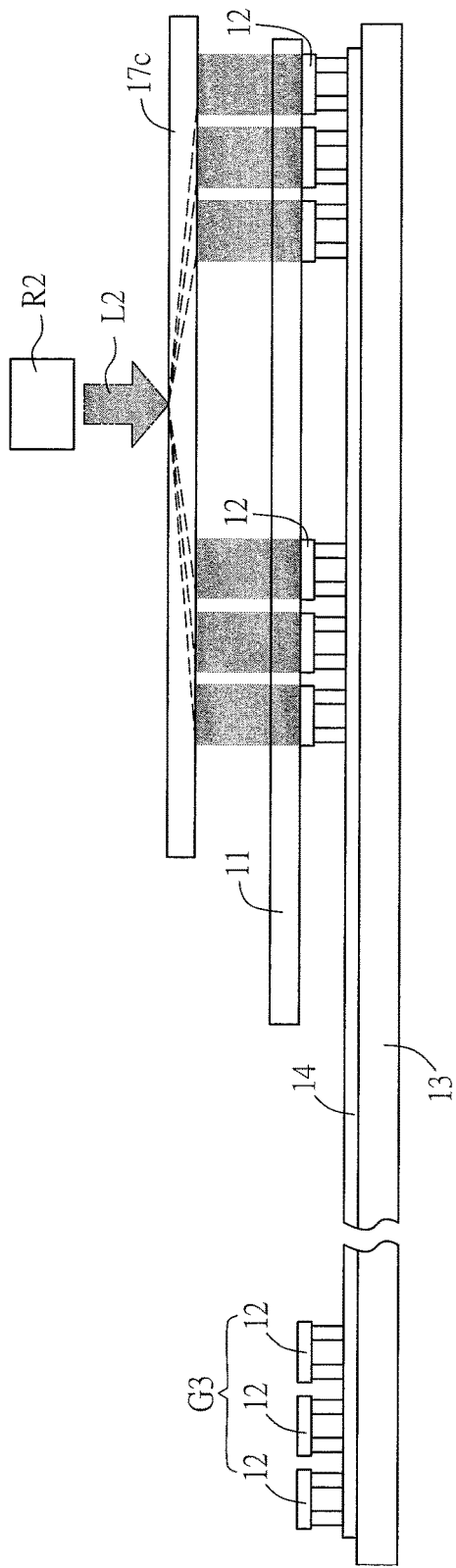
Figure 5J:
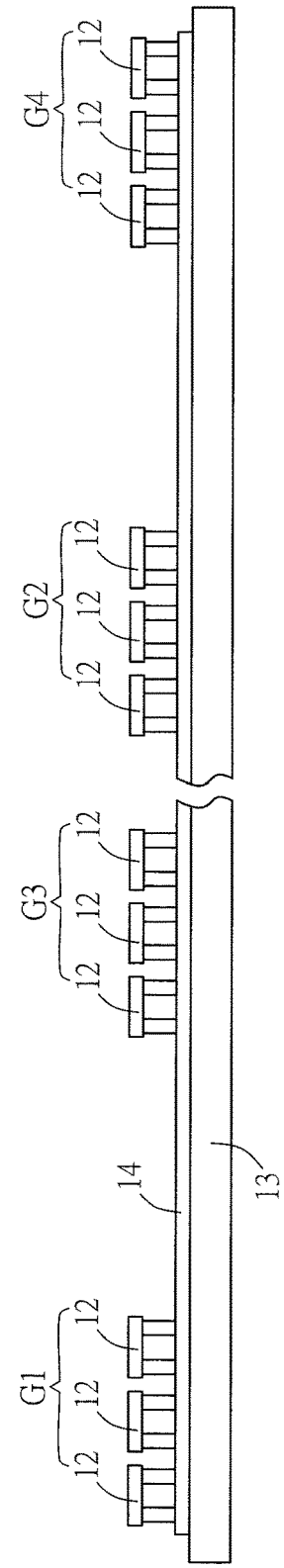

Because the first and the third of microsized optoelectronic semiconductor elements G1 and G3 have been disposed on the matrix circuit 14, the second and the fourth group of microsized optoelectronic semiconductor elements G2 and G4 remain on the epitaxial substrate 11. As shown in FIGS. 5E and 5F, in order to dispose the second and the fourth group of microsized optoelectronic semiconductor elements G2 and G4 on the matrix circuit 14, the epitaxial substrate 11 needs to moved rightwards for a distance and then downwards for undergoing another step of electrode alignment and lamination S03. After the alignment and the lamination are accomplished, the structure of FIG. 5G can be obtained. Then, the same step of electrode coupling S04 (FIG. 5H) and the step of illumination and lift-off S05 (FIG. 5I) are performed to obtain the structure of FIG. 5J.

For manufacturing a full-color display device, the manufacturing method of this embodiment further includes the steps of: disposing a photoluminescent layer 18 on the microsized optoelectronic semiconductor elements 12 and disposing a filter substrate 19 on the photoluminescent layer 18, wherein the filter substrate 19 includes a plurality of filter blocks 191 which correspond to the microsized optoelectronic semiconductor elements 12 respectively, so as to obtain the optoelectronic semiconductor device 1c. Herein, it is performed to dispose the optoelectronic elements of different color-displayed wavelengths for achieving the purpose of displaying various colors. In this embodiment, a photoluminescent layer 18 is disposed on the microsized optoelectronic semiconductor elements 12 which face the matrix circuit 14. The photoluminescent layer 18 can be a structure layer of quantum dots. The photoluminescent layer 18 of this embodiment is a structure layer of quantum dots for example, which can emit red light and green light by absorbing the high energy lights (such as blue light) emitted from the microsized optoelectronic semiconductor elements 12. Moreover, in the process of disposing the photoluminescent layer 18 of this embodiment, the film of the photoluminescent layer 18 containing quantum dots can be attached on the microsized optoelectronic semiconductor elements 12, or the adhesive containing quantum dots can be distributed on the microsized optoelectronic semiconductor elements 12, so as to form the photoluminescent layer 18. This invention is not limited thereto.

The filter substrate 19 is disposed on the side of the photoluminescent layer 18 farther from the substrate 13. Herein, the filter substrate 19 is disposed on an upper surface of the photoluminescent layer 18. In addition to the filter blocks 191, the filter substrate 19 further includes a transparent substrate 192 and a light-mix prevention layer 193. The filter blocks 191 are disposed on the surface of the transparent substrate 192 facing the photoluminescent layer 18 and correspond to the microsized optoelectronic semiconductor elements 12 respectively. The transparent substrate 192 can be a hard board or a soft board. The filter blocks 191 of this embodiment sequentially include a red filter block 191, a green filter block 191 and a blue filter block 191 (three colors constitute a group of filter blocks to correspond to a group of microsized optoelectronic semiconductor elements) so as to allow the passing of the red light, the green light and the blue light of three primary colors. Moreover, the light-mix prevention layer 193 is disposed on the transparent substrate 192 and around the filter blocks 191, so as to prevent the mix of two adjacent lights of different colors. Herein, the filter substrate 19 can be a color filter substrate (CF substrate) of a conventional liquid crystal display device, so as to facilitate the full colorization of the optoelectronic semiconductor device 1c.

Therefore, in the optoelectronic semiconductor device 1c, a microsized optoelectronic semiconductor element 12 can correspond to a sub-pixel, and a group of microsized optoelectronic semiconductor elements (three) can correspond to a pixel. Herein, the optoelectronic semiconductor device 1c is a full-color display panel for example, and can be applied to a VR head-mounted head-up display for example.

Please refer to FIGS. 6A and 6B, which are schematic diagrams of the applications of the optoelectronic semiconductor device 1c of the fourth embodiment of the invention.

If the substrate 13 and the transparent substrate 192 of the manufactured optoelectronic semiconductor device 1c of the fourth embodiment both are a soft substrate with flexibility, they can be bent to be attached on a curved substrate. As shown in the application of FIGS. 6A and 6B, the substrate 13 of the optoelectronic semiconductor device 1c can be attached on a curved substrate 20. Herein, the curved substrate 20 is, for example, a windscreen of a VR head-mounted head-up display device. Besides, for example, an optically clear adhesive (OCA, not shown) can be used to adhere the substrate 13 to the curved substrate 20, so that the substrate 13 and the curved substrate 20 are attached together to obtain the display device as shown in FIG. 6B, which can be applied to a VR display for example. Herein, the substrate 13 is attached on an upper surface of the curved substrate 20, but however, it can be attached on a lower surface of the curved substrate 20. This invention is not limited thereto.

In summary, the manufacturing method of the optoelectronic semiconductor device of the invention includes the step of providing a microsized optoelectronic semiconductor element, a step of providing a matrix substrate, a step of electrode alignment and lamination, a step of electrode coupling, a step of illumination and lift-off and a step of removal. The step of electrode coupling is to provide a first light to concentratedly illuminate at least some of the junctions between the first electrodes and the third electrodes or concentratedly illuminate at least some of the junctions between the second electrodes and the fourth electrodes. The step of illumination and lift-off is to provide a second light to concentratedly illuminate at least some of the interfaces between the microsized optoelectronic semiconductor elements and the epitaxial substrate so that the microsized optoelectronic semiconductor elements illuminated by the second light can peel off from the epitaxial substrate. However, for the optoelectronic device manufactured by using conventional LEDs, the epitaxial and photolithography processes are used and then the half cutting, probing and full cutting are performed to obtain the individual LEDs, which are then transferred for the subsequent processes. Therefore, in comparison with the conventional art, individual LEDs needn't be transferred to other substrates in the manufacturing process of the optoelectronic semiconductor device of this invention, so the manufacturing process is simpler and faster, and the optoelectronic semiconductor device is reduced in the manufacturing time and cost.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An optoelectronic semiconductor device, comprising:
a matrix substrate including a matrix circuit and a substrate, wherein the matrix circuit is disposed on the substrate; and
a plurality of microsized optoelectronic semiconductor elements disposed separately and disposed on the matrix circuit;
wherein each of the microsized optoelectronic semiconductor elements includes a first electrode and a second electrode, the matrix circuit includes a plurality of third electrodes and a plurality of fourth electrodes, the first electrodes are coupled with and electrically connected with the third electrodes respectively, or the second electrodes are coupled with and electrically connected with the fourth electrodes respectively, and reflectivities of at least some of junctions between the first electrode and the third electrode or reflectivities of at least some of junctions between the second electrode and the fourth electrode are less than 20%.

2. The optoelectronic semiconductor device as recited in claim 1, wherein the substrate is a soft substrate.

3. The optoelectronic semiconductor device as recited in claim 1, wherein a length of a side of each of the microsized optoelectronic semiconductor elements is between 1 μm and 100 μm.

4. The optoelectronic semiconductor device as recited in claim 1, wherein the optoelectronic semiconductor device is applied to a display panel, an advertisement board, a sensing device, a semiconductor device or an illuminating device.

5. The optoelectronic semiconductor device as recited in claim 4, wherein the display panel is applied to a virtual reality (VR) head-mounted display, an augmented reality (AR) head-mounted display or a head-up display (HUD).

6. The optoelectronic semiconductor device as recited in claim 1, wherein the optoelectronic semiconductor device is a single-color device or a full-color device.

7. The optoelectronic semiconductor device as recited in claim 1, wherein the microsized optoelectronic semiconductor elements are arranged in an array, or arranged in a staggered manner.

8. The optoelectronic semiconductor device as recited in claim 1, wherein a minimum interval between two adjacent microsized optoelectronic semiconductor elements is equal to or less than 1 μm.

9. The optoelectronic semiconductor device as recited in claim 1, wherein the material of the microsized optoelectronic semiconductor elements is GaN, AlGaAs, GaP, GaAsP, or AlGaInP.

10. The optoelectronic semiconductor device as recited in claim 1, wherein the substrate is made of transparent material or opaque material.

11. The optoelectronic semiconductor device as recited in claim 10, wherein the transparent material is selected from glass, quartz, plastic material, rubber, glass fiber, and polymer.

12. The optoelectronic semiconductor device as recited in claim 10, wherein the opaque substrate is a metal-fiberglass composite plate or a metal-ceramics composite plate.

* * * * *